United States Patent
Hanawa

[11] Patent Number: 6,091,242
[45] Date of Patent: Jul. 18, 2000

[54] MAGNETIC REASONANCE DIAGNOSIS APPARATUS

[75] Inventor: Masatoshi Hanawa, Otawara, Japan

[73] Assignee: Kabushiki Kaisha Toshiba, Kawasaki, Japan

[21] Appl. No.: 09/149,447

[22] Filed: Sep. 9, 1998

[30] Foreign Application Priority Data

Sep. 10, 1997 [JP] Japan ................................. 9-245350

[51] Int. Cl.$^7$ ................................................. G01V 3/00
[52] U.S. Cl. .................... 324/307; 324/300; 324/309; 600/410; 600/412
[58] Field of Search ................................. 324/309, 307, 324/300; 600/410, 112

[56] References Cited

U.S. PATENT DOCUMENTS

5,142,231  8/1992  Jensen et al. ......................... 324/309

Primary Examiner—Christine K. Oda
Assistant Examiner—Brij B. Shrivastav
Attorney, Agent, or Firm—Nixon & Vanderhye, P.C.

[57] ABSTRACT

An inversion pulse is applied to the subject in a static magnetic field. An excitation pulse is applied after a delay time depending on the time constant of the longitudinal relaxation of the spins of proton contained in fat molecule from this inversion pulse. As a result, the spins of proton contained in the fat molecule can be suppressed at high precision. On the basis of the MR signal collected after this suppression, the resonance frequency data of the spins of proton contained in water molecule which is not suppressed or the data corresponding to this resonance frequency, or the magnetic field distribution data of the static magnetic field or the data corresponding to this magnetic field distribution can be determined at high precision.

14 Claims, 4 Drawing Sheets

MAGNETIC REASONANCE DIAGNOSIS APPARATUS

BACKGROUND OF THE INVENTION

It is known that the atomic nucleus containing an odd number of protons or an odd number of neutrons has magnetic and hence generates a nuclear magnetic dipole moment. When this nuclear magnetic dipole moment is placed in a static magnetic field, the nuclear magnetic dipole moment makes a rotary motion called precession at an angular frequency determined by the product of the intrinsic magnetogyric ratio of the nucleus and the intensity of the static magnetic field. In this state, when a rotating magnetic field is applied to the nuclear magnetic dipole moment at this angular frequency, the precession of the nuclear magnetic dipole moment becomes gradually violent.

Regarding this motion in a rotating coordinate systems rotating at the same angular frequency as in the rotating magnetic field, putting the z' axis in the direction of static magnetic field, the nuclear magnetic dipole moment is tilted from the z' axis toward the x'-y' plane. This tilting angle generally is called the flip angle, which is determined by the magnetogyric ratio, intensity of rotating magnetic field, and application time of the rotating magnetic field.

When the rotating magnetic field is applied in the condition of the flip angle of, for example, 90°, and then the rotating magnetic field is stopped, the nuclear magnetic dipole moment returns gradually from the x'-y' plane to the initial state aligned in the z' axis before application of the rotating magnetic field while making precession. This process is explained by two processes, that is, longitudinal relaxation process for recovering the magnetized components in the static magnetic field direction, and transverse relaxation process for attenuating the magnetized components in the x'-y' plane. The longitudinal relaxation process is also called the spin-lattice relaxation or T1 relaxation, and its time constant is generally expressed as T1. The transverse relaxation process is called the spin-spin relaxation or T2 relaxation, and its time constant is T2.

Such magnetizing motion in the relaxation process can be observed by a coil placed in the x'-y' plane. In other words, the precession of magnetization induces a magnetic flux change in the coil, and therefore, according to the Faraday's electromagnetic induction law, an electromotive force at the aforementioned angular frequency is generated at both ends of the coil. This electromotive force is the so-called magnetic resonance signal (MR signal).

From the MR signal collected by utilizing such nuclear magnetic resonance phenomenon, the spatial distribution of a specific nucleus and the state of various molecules containing the nucleus can be observed.

To obtain a magnetic resonance image of high diagnostic ability, it is important to detect the resonance frequency of the nucleus accurately and enhance the spatial uniformity of static magnetic field.

Herein, to achieve the two objects, hitherto, as the preparatory steps for imaging, the processes called frequency lock and shimming are executed.

The frequency lock is to specify the resonance frequency or center frequency of the nuclide (since the resonance frequency has a certain bandwidth, its central value (or peak value) is thus called representatively). For instance, if the intensity of the static magnetic field is 1.5 T, it may be actually 1.5 T±α owing to the drift of the main magnet or other factors, and when the intensity of the static magnetic field is deviated from 1.5 T, the resonance frequency of the nuclide is deviated accordingly, and hence frequency lock is an indispensable step. Without this step, the area may be different from the region to be imaged, and other spin than aimed may be excited.

Shimming or active shimming is to correct spatial fluctuation of static magnetic field (nonuniformity of static magnetic field). Nonuniformity of static magnetic field occurs also in the presence of the object, and if it is not corrected, various artifacts may be caused or undesired region may be excited. In a typical example, therefore, the spatial magnetic field distribution of the imaging region is determined, and the linear or nonlinear gradient magnetic field for making it uniform is obtained, and shimming is achieved by superposing it on the static magnetic field.

Figure 7:
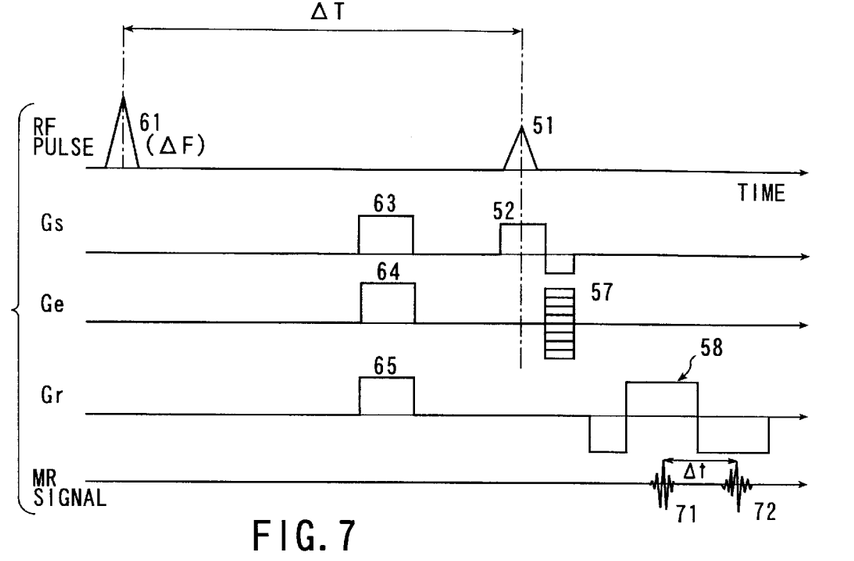
FIG. 7 is a diagram showing a pulse sequence designed for measurement of magnetic field distribution in the present embodiment.

In the same nucleus, however, the intensity of the magnetic field that the nucleus actually feels varies somewhat due to the effect of electrons surrounding the nucleus, that is, the magnetic field shielding effect. Since the state of electrons varies with the molecules containing the nucleus, and therefore the resonance frequency is slightly deviated depending on the molecules. This deviation is called the chemical shift. For example, supposing the object nucleus to be proton ($^1$H), the difference in chemical shift between water and fat containing it is deviated by about 3.5 ppm as shown in FIG. 7. This 3.5 ppm corresponds to about 224 Hz, supposing the static magnetic field intensity to be 1.5 tesla.

This chemical shift includes various artifacts, for example, deviation of position of water and position of fat on the image, but, to the contrary, it is attempted to utilize this chemical shift. Principal applications include the chemical shift imaging for providing the image only for the nucleus contained in a specific molecule, and MR spectroscopy for presenting frequency spectrum of MR signal. From these data, for example, a water image may be created, or various useful information relating to metabolic functions, for example, the mode of compound produced by metabolism can be obtained.

Such chemical shift imaging and MR spectroscopy are significantly influenced by the non-uniformity of the static magnetic field. In particular, the chemical shift selective pulse (CHESS pulse) widely used in such chemical shift imaging or MR spectroscopy is likely to be influenced by the non-uniformity of static magnetic field. This CHESS pulse is adjusted in a relatively narrow bandwidth around the actual resonance frequency so as to excite or invert selectively only the specific nucleus contained in the specific molecule. For effective function of the CHESS pulse, the so-called frequency lock is indispensable, that is, the center frequency must be accurately adjusted to the resonance frequency of the specific nucleus contained in the specific molecule. Also, in order that the action the magnetization receives from the CHESS pulse may not fluctuate depending on the location, the current flowing in the shim coil must be adjusted to suppress spatial variations of the strength of static magnetic field, that is, non-uniformity of static magnetic field at, for example, less than 1 ppm, and hence the magnetic field distribution is dynamically corrected, which is known as dynamic shimming.

Figure 1:
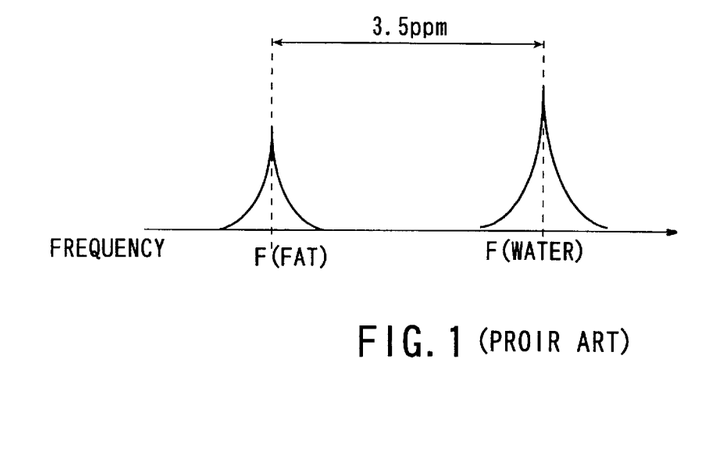
FIG. 1 is a diagram showing difference in chemical shift between proton contained in water molecule and proton contained in fat molecule.

For frequency lock, the actually collected MR signal is Fourier transformed, and from the obtained frequency spectrum, it is required to measure accurately the true value of the resonance frequency of the object nucleus. FIG. 1 shows a frequency spectrum obtained by Fourier transform of the MR signal collected from the proton spins. Since the resonance frequency Ffat of proton contained in the fat molecule is lower than the resonance frequency Fwater of proton contained in the water molecule, the lower one of the two peaks can be identified as Ffat and the higher one as Fwater.

However, if one of fat and water is hardly present within the object slice, only one peak appears in the frequency spectrum. Therefore, only two peak frequencies cannot be judged to be either Ffat or Fwater.

The effect of shimming is exhibited only when performed along the accurate magnetic field distribution. Therefore, the difference in chemical shift between fat and water is a serious obstacle for accurate measurement of magnetic field distribution.

BRIEF SUMMARY OF THE INVENTION

It is hence an object of the present invention to provide a magnetic resonance diagnosis apparatus capable of measuring at least one of resonance frequency data, its corresponding data, magnetic field distribution data, and its corresponding data, at high precision, by eliminating the error due to chemical shift.

According to the present invention, an inversion pulse is applied to the subject placed in a static magnetic field, and after a delay time from this inversion pulse depending on the time constant of one longitudinal relaxation of the spins of the nuclide contained in a first molecule and the spins of the same nuclide contained in a second molecule, and excitation pulse is applied, and therefore one of the spins of the nuclide contained in the first molecule and the spins of the same nuclide contained in the second molecule can be suppressed at high precision. On the basis of the MR signal collected after this suppression, the resonance frequency data of the spins of the nuclide contained in the first or second molecule not suppressed or the data corresponding to this resonance frequency, or the magnetic field distribution data of the static magnetic field or the data corresponding to this magnetic field distribution can be determined at high precision.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments give below, serve to explain the principles of the invention.

DETAILED DESCRIPTION OF THE INVENTION

Preferred embodiments of the invention will be described below referring to the drawings.

Figure 2:
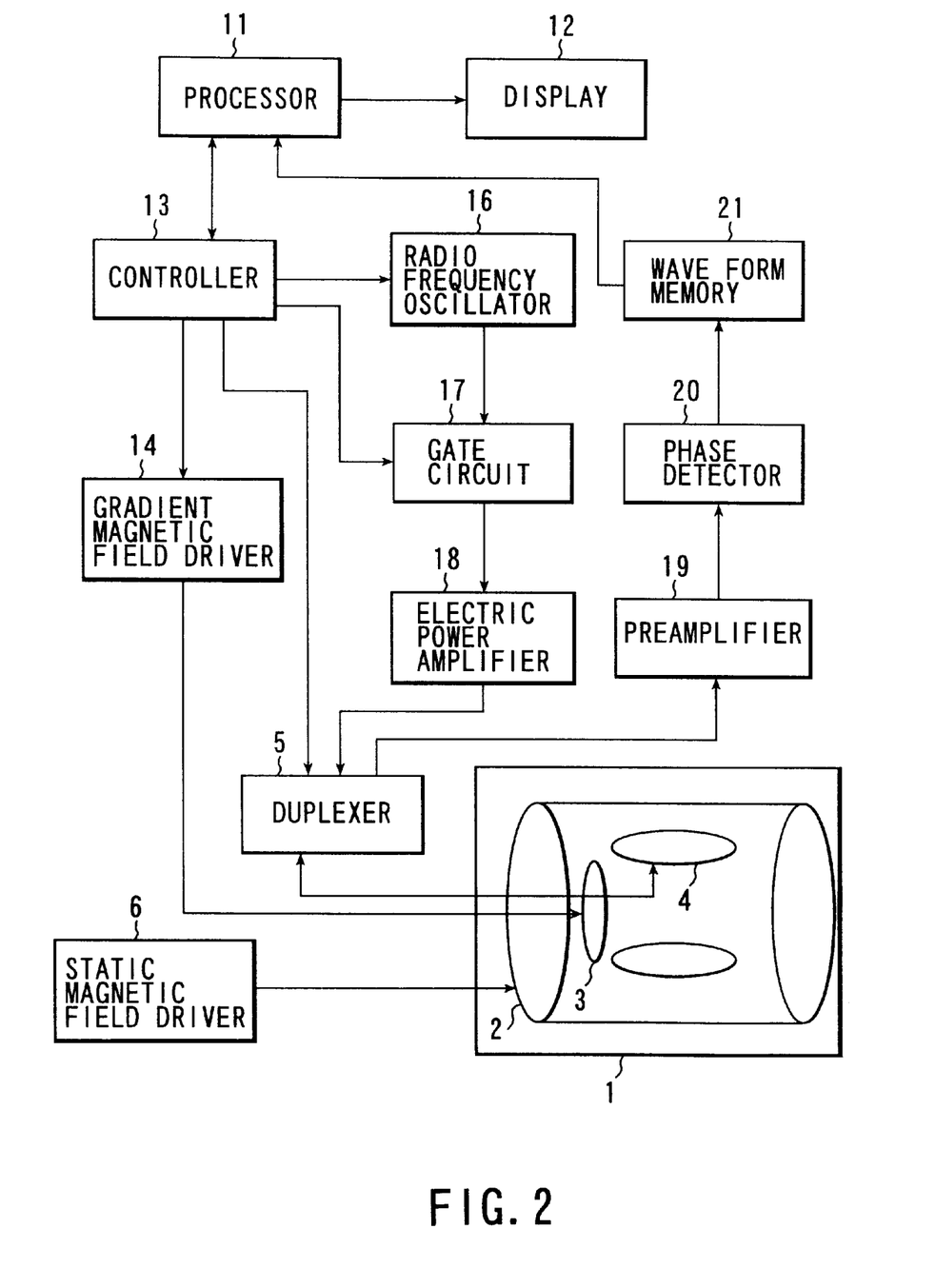
FIG. 2 is a structural diagram of a magnetic resonance diagnosis apparatus in a preferable embodiment of the present invention.

FIG. 2 shows a constitution of a magnetic resonance diagnosis apparatus according to the present embodiment. A magnet assembly 1 includes a static magnetic field coil 2, gradient magnetic field coils 3, and radio frequency magnetic field coil 4 arranged near the space (imaging region) for accommodating the subject.

The static magnetic field coil 2 is composed of normal conductive coil and superconducting coil, and generates a static magnetic field in the imaging region together with a static magnetic field coil driver 6. Herein, the direction of the static magnetic field is defined to be the Z axis. The gradient magnetic field coils 3 generate X axis gradient magnetic field, Y axis gradient magnetic field, and Z axis gradient magnetic field, individually together with a gradient magnetic field driver 14. The gradient magnetic fields are overlaid on the static magnetic field.

A radio frequency oscillator 16 generates a radio frequency signal. The frequency of this radio frequency signal is controlled by a controller 13. A gate circuit 17 gates the timing of the radio frequency signal from the radio frequency oscillator 16 in order to determine the pulse width of the radio frequency pulse. The gate circuit 17 also modulates the frequency of the radio frequency pulse in order to determine the center frequency and the frequency bandwidth of the radio frequency pulse. The gate period is controlled by the controller 13. The center frequency and the frequency bandwidth of the radio frequency pulse are controlled by the controller 13.

An electric power amplifier 18 amplifies the radio frequency pulse from the gate circuit 17. The amplified radio frequency pulse is supplied into a radio frequency magnetic field coil 4 through a duplexer 5. As a result, a radio frequency magnetic field pulse is generated from the radio frequency magnetic field coil 4. The pulse period of the radio frequency magnetic field pulse is same as in the gate period. The center frequency and the frequency bandwidth of the radio frequency magnetic field pulse are same as the center frequency and the frequency bandwidth of the radio frequency pulse.

When receiving, an MR signal is induced in the radio frequency magnetic field coil 4. This MR signal is amplified in a preamplifier 19, and is detected of phase in a phase detector 20, and is stored in a waveform memory 21.

A processor 11 processes the data stored in the waveform memory 21, and obtains the following data.

1) Resonance frequency data of spins of proton contained in water molecule (hereinafter called water spins)
2) Data corresponding to resonance frequency of water spins
3) Resonance frequency data of spins of proton contained in fat molecule (hereinafter called fat spins)
4) Data corresponding to resonance frequency of fat spins
5) Magnetic field distribution data showing spatial distribution of intensity of static magnetic field
6) Data corresponding to magnetic field distribution showing spatial distribution of intensity of static magnetic field
7) MRI (magnetic resonance imaging) data
8) MRS (magnetic resonance spectroscopy) data
9) MRSI (magnetic resonance spectroscopic imaging) data The aforementioned data 1) to 6) are utilized directly or indirectly in the pulse sequence for execution for obtaining data 7) to 9). The pulse sequence executed for obtaining the data 1) to 6) is called the preparation pulse sequence, and the pulse sequence executed for obtaining data 7) to 9) is called the main pulse sequence.

The aforementioned data 1) to 4) are used as fundamental data for adjusting the center frequency and frequency bandwidth of the RF pulse, for example, a slice selective pulse, chemical shift a selective pulse contained in the main pulse sequence. The aforementioned data 5) and 6) are used as fundamental data for adjusting the current flowing in the shim coil for correcting the non-uniformity of static magnetic field of main pulse sequence.

The display 12 is provided for displaying the data determined in the processor 11.

The operation of the present embodiment is described below. First, terms are defined below.

The excitation pulse is a RF pulse having a function of exciting magnetization spins for generating transverse magnetized components. When excitation pulse is applied, the magnetization spins are tilted by, for example, 90° about the x or y axis.

The refocus pulse is a RF pulse having a function of focusing the transverse magnetized components of the spins dispersed by the transverse relaxation phenomenon. When refocus pulse is applied, the spins are rotated by, for example, 180° about the x or y axis.

The inversion pulse inverts the polarity of the magnetization spins at the position of longitudinal magnetization. In other words, it is a RF pulse having a function of inverting the magnetization spins from +Z to −Z. When inversion pulse is applied, the spins are rotated by, for example, 180° about the x or y axis to be aligned in −Z.

Figure 3:
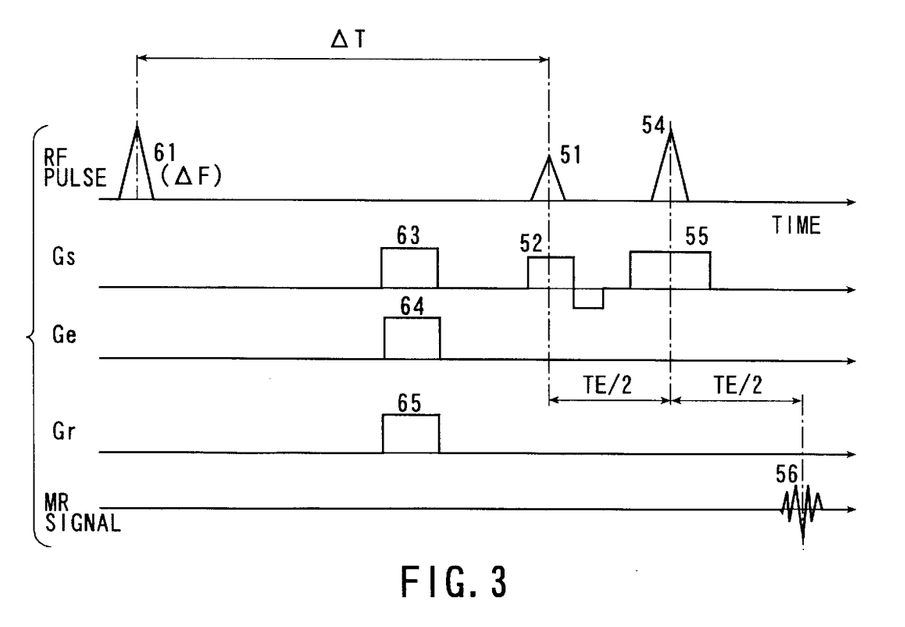
FIG. 3 is a diagram showing a pulse sequence designed for measurement of true value of resonance frequency of proton spins contained in water molecule in the present embodiment.

FIG. 3 shows the preparation pulse sequence for obtaining data 1) or 2),that is, the preparation pulse sequence for obtaining the resonance frequency of water spins or its corresponding value. This preparation pulse sequence contains a pre-pulse for so-called fat suppression so that the MR signal that is, in other words, the MR signal from the fat spins may not be guided into the radio frequency magnetic field coil 4. As the method of fat suppression, it is a main method to apply a gradient magnetic field for dephase after selectively exciting only the fat spins by the chemical shift selective pulse, but it cannot be employed because accurate resonance frequency of fat spins is unknown, that is, it is contrary to the defined condition that the center frequency and frequency bandwidth in the chemical shift selective pulse cannot be optimized.

In other words, it is necessary to search a technique for realizing fat suppression if the accurate resonance frequency of fat spins is unknown. What is finally employed is a technique of suppressing fat spins on the basis of the difference between the time constant T1 (fat) of longitudinal relaxation of fat spins, and the time constant T1 (water) of longitudinal relaxation of water spins.

Figure 4:
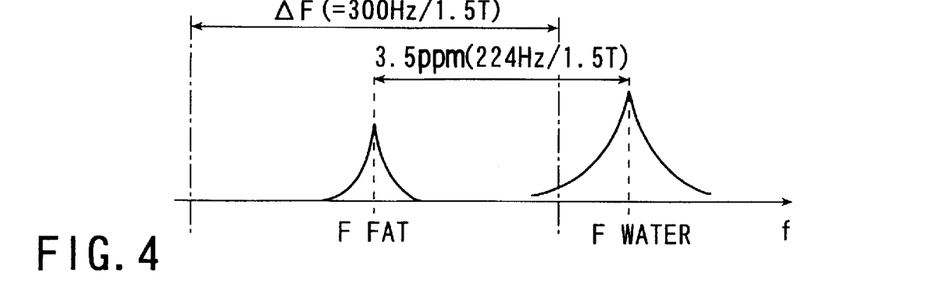
FIG. 4 is a diagram showing a frequency bandwidth of CHESS pulse 61 in FIG. 3.

First, an inversion pulse 61 is applied to the subject. This inversion pulse 61 is not a slice selective pulse. The center frequency Ffat of the inversion pulse 61 is, as shown in FIG. 4, set in the resonance frequency of fat spins calculated according to Larmor's formula, from the intensity of static magnetic field in calculation, magnetogyric ratio intrinsic to proton spins, and chemical shift of fat spins.

The bandwidth ΔF of the inversion pulse 61 is set in a relatively wide bandwidth, on the basis of the timely fluctuations of the magnetic field intensity and spatial fluctuations of the magnetic field intensity. More specifically, the magnetic field intensity varies a maximum of 0.1 ppm per hour. The spatial variance of magnetic field intensity is 6 ppm at maximum. In other words, the maximum fluctuation of resonance frequency of fat spins is 5 ppm, and for example, at 1.5 tesla, fluctuation of 300 Hz is assumed at maximum. Therefore, in the case of 1.5 tesla, by setting the bandwidth ΔF of the inversion pulse 61 at 300 Hz or more, allowing time and spatial variations, almost all fat spins can be inverted.

Incidentally, if the object of suppression is water spins, the center frequency Fwater of the inversion pulse 61 is set in the resonance frequency of water spins calculated according to Larmor's formula, from the intensity of static magnetic field in calculation, magnetogyric ratio intrinsic to proton spins, and chemical shift (zero) of water spins. The bandwidth ΔF of the inversion pulse 61 may be 300 Hz or more same as in the case of fat suppression.

Next to this inversion pulse 61, gradient magnetic field pulses for spoiler 63 to 65 are applied. As a result, if the flip angle by the inversion pulse 61 is incomplete, by spoiling the transverse magnetized components of fat spins generated by this, MR signal can be prevented from being issued from fat spins.

After the gradient magnetic field pulses for spoiler 63 to 65, a first excitation pulse 51 out of plural radio frequency magnetic field pulses contained in the signal generation sequence, herein, the spin echo sequence is applied together with a gradient magnetic field pulse for slice selection 52. The center of this excitation pulse 51 is delayed from the center of the inversion pulse 61 by time ΔT.

Figure 5:
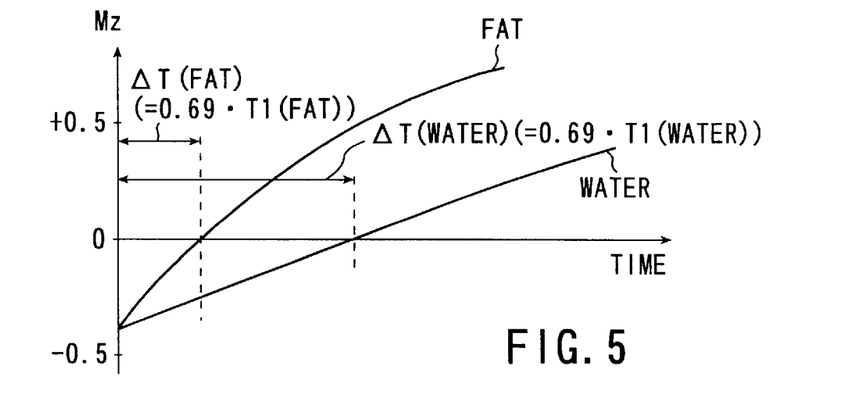
FIG. 5 is a diagram comparing a longitudinal relaxation curve of proton spins contained in water molecule, and longitudinal relaxation curve of proton spins contained in fat molecule, in order to show the interval T1 (fat) in FIG. 3.

This delay time ΔT is set to satisfy the following formula (1) so that the longitudinal magnetized components of fat spins may be substantially zero in the center of the excitation pulse 51 as shown in FIG. 5. Supposing the flip angle by the inversion pulse 61 to be θ, and the time constant of longitudinal relaxation of fat spins to be T1(fat), it is set to satisfy formula (1).

$$1 = (1 - \cos \theta) \exp(-\Delta T / T1(\text{fat})) \tag{1}$$

For example, it is set at ΔT=0.69 T1(fat).

Meanwhile, since the time constant of longitudinal relaxation of water spins is slightly different from the time constant of longitudinal relaxation of fat spins, in the center of the excitation pulse 51, longitudinal magnetized components of water spins are present. When the resonance frequency of water spins is present in the bandwidth of the inversion pulse 61, water spins are inverted together with fat spins, but in this case, as shown in FIG. 5, the longitudinal magnetized components of water spins are always present in the center of the excitation pulse 51.

By thus setting the delay time ΔT, water spins generate transverse magnetized components by the excitation pulse 51, but fat spins do not generate transverse magnetized components, that is, it is possible to set the state in which MR signal is not delivered from the fat spins. When the object of suppression is water spins, the delay time ΔT is set at the time determined by replacing T1(fat) of formula (1) with the time constant T1(water) of longitudinal relaxation of water spins.

Successively to the excitation pulse 51, a refocus pulse 54 is applied together with a gradient magnetic field pulse for slice selection 55, and in the echo time, the MR signal (spin echo signal) from the water spins only is sampled at a sufficiently high sampling frequency.

Figure 6A:
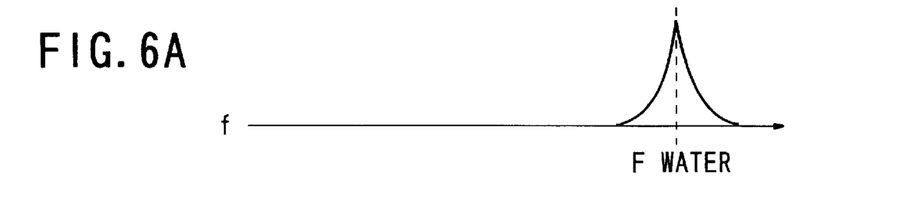
FIG. 6A is a diagram showing a frequency spectrum obtained by Fourier transform of MR signal collected from the pulse sequence in FIG. 3.

This echo signal is Fourier transformed in the processor 11. As a result, a frequency spectrum as shown in FIG. 6A is obtained. Since the fat spins are suppressed, in this frequency spectrum, only one peak corresponding to the resonance frequency of water spins appears. Therefore, if fat is hardly present in the object slice, one peak frequency can be identified as the resonance frequency of water spins.

The resonance frequency of fat spins is determined by adding the frequency corresponding to 3.5 ppm of chemical shift of the both, or 224 Hz in the case of 1.5 tesla, to the measured resonance frequency of water spins.

Figure 6B:
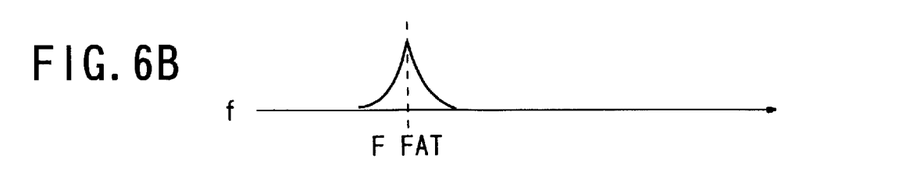
FIG. 6B is a diagram showing a frequency spectrum obtained by Fourier transform of MR signal collected from the pulse sequence designed for measurement of true value of resonance frequency of proton spins contained in fat molecule, contrary to FIG. 3.

When water spins are suppressed, as shown in FIG. 6B, the peak corresponding to the resonance frequency of water spins does not appear on the frequency spectrum, and only the peak corresponding to the resonance frequency of fat spins appears. The resonance frequency of water spins is determined by subtracting the frequency corresponding to 3.5 ppm of chemical shift of the both, or 224 Hz in the case of 1.5 tesla, from the measured resonance frequency of fat spins.

Incidentally, regardless of the existing state of fat and water in the slice, both resonance frequencies can be measured. The frequency spectrum (first frequency spectrum) is determined by the fat suppression pulse sequence shown in FIG. 3. By the pure spin echo pulse sequence free from fat suppression portion, the frequency spectrum (second frequency spectrum) is determined. A third frequency spectrum is determined by Fourier transform of the differential signal of the echo signal collected from the fat suppression pulse sequence and the echo signal collected from the pure spin echo pulse sequence. Depending on the case, as described below, the apparition manner of peak of each frequency spectrum varies.

First case (both fat and water are present): In the first frequency spectrum, one peak expressing the resonance frequency of water spins appears. In the second frequency spectrum, a peak expressing the resonance frequency of fat spins and a peak expressing the resonance frequency of water spins appear. In the third frequency spectrum, one peak expressing the resonance frequency of fat spins appears.

Second case (fat is absent and only water is present): In the first and second frequency spectra, one peak expressing the resonance frequency of water spins appears. In the third frequency spectrum, no peak appears.

Third case (water is absent and only fat is present): In the first frequency spectrum, one peak expressing the resonance frequency of fat spins appears. In the second and third frequency spectra, no peak appears.

According to this technique, regardless of the case, the resonance frequency can be determined by distinguishing water and fat.

According to thus obtained data 1) to 4), the center frequency and frequency bandwidth of the chemical shift selective pulse (RF pulse) in the main pulse sequence are adjusted. Therefore, only the proton contained in water or fat molecule can be imaged.

Next is explained the preparation pulse sequence for determining the data 5) and 6),that is, the magnetic field distribution or the corresponding data. FIG. 7 shows an example of this preparation pulse sequence. In FIG. 7, the same pulses as in the preparation pulse sequence in FIG. 3 are identified with same reference numerals. This preparation pulse sequence starts with the inversion pulse 61 same as in the preparation pulse sequence in FIG. 3, and after the delay time ΔT from the inversion pulse 61 through spoiler pulses 63–65, an excitation pulse 51 is applied together with a gradient magnetic field pulse 52 for slice selection. Next, to provide the MR signal with spatial information, a gradient magnetic field pulse for phase encoding 57 is applied. Consequently, by an alternated gradient magnetic field 58, gradient echoes 71,72 are collected in series.

Since the phase of MR signal is determined depending on the integration of intensity of magnetic field being experienced, the phase difference between the gradient echoes 71 and 72 differs, in the location where the intensity of static magnetic field is different, depending on the difference in intensity. In other words, the spatial distribution data of the phase difference is given as the data corresponding to the magnetic field distribution. A phase difference of echo appears of $\Delta\theta=\gamma\Delta\beta\cdot\Delta t$. $\Delta t$ is an interval between peaks of echo 71 and 72. Hence, ΔB of each pixel is determined.

On the basis of thus obtained magnetic field distribution or its corresponding data, by adjusting the current flowing in the shim coil in the period of main pulse sequence, the uniformity of static magnetic field can be enhanced. As a result, the information relating to the chemical shift is obtained at high precision.

Figure 8:
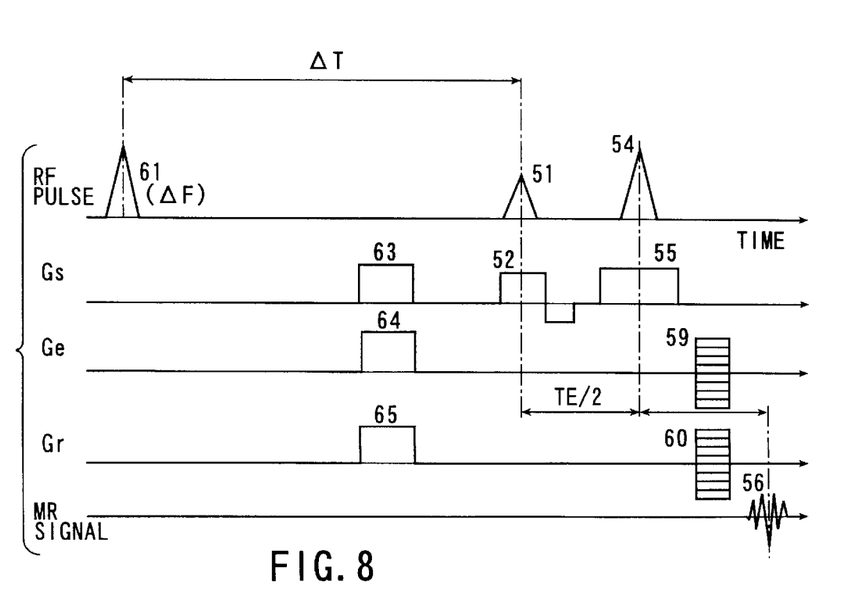
FIG. 8 is a diagram showing other pulse sequence designed for measurement of magnetic field distribution in the present embodiment.

In the preparation pulse sequence shown in FIG. 8, the magnetic field distribution or its corresponding data can be determined. In FIG. 8, same pulses as in the preparation pulse sequence in FIG. 3 are identified with same reference numerals. This preparation pulse sequence starts with the inversion pulse 61 same as in the preparation pulse sequence in FIG. 3, and after the delay time ΔT from the inversion pulse 61 through spoiler pulses 63–65, an excitation pulse 51 is applied together with a gradient magnetic field pulse 52 for slice selection. Next, to provide the MR signal with spatial information of two axes, two phase encode pulses 59, 60 are applied, and two axes in the slice are encoded. At echo time, MR signal (echo) is collected. The frequency of echo signal depends on the resonance frequency of water spins of each location. Since the resonance frequency of water spins depends on the external magnetic field, the spatial distribution data of echo signal frequency is given as the data corresponding to the magnetic field distribution.

Not limited to the illustrated embodiments, of course, the invention may be changed and modified in various forms.

Additional advantages and modifications will readily occurs to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic resonance diagnosis apparatus comprising:
   means for applying an inversion pulse to the subject in a static magnetic field, in order to selectively suppress one of spins of nuclide contained in first molecule and spins of the same nuclide contained in second molecule on the basis of the difference in the longitudinal relaxation time, and applying an excitation pulse after a delay time corresponding to the time constant of longitudinal relaxation of one of the spins of the nuclide contained in the first molecule and the spins of the same nuclide contained in the second molecule from the inversion pulse;

means for collecting MR signals from other one of the spins of the nuclide contained in the first molecule and the spins of the same nuclide contained in the second molecule; and means for obtaining at least one of resonance frequency data of the other one of the spins of the nuclide contained in the first molecule and the spins of the same nuclide contained in the second molecule, data corresponding to resonance frequency, magnetic field distribution data of the static magnetic field, and data corresponding to magnetic field distribution, on the basis of the MR signals.

2. A magnetic resonance diagnosis apparatus according to claim 1, wherein the first molecule is water, the second molecule is fat, and the nuclide is proton.

3. A magnetic resonance diagnosis apparatus according to claim 1, wherein the delay time is set so that the longitudinal magnetized components of the spins of the nuclide contained in the first molecule and the spins of the same nuclide contained in the second molecule become substantially zero in the center of the excitation pulse.

4. A magnetic resonance diagnosis apparatus according to claim 1, wherein the delay time $\Delta T$ is set to satisfy the following formula, supposing the flip angle of the inversion pulse to be $\theta$, and the time constant of longitudinal relaxation of one of the spins of the nuclide contained in the first molecule and the spins of the same nuclide contained in the second molecule to be T1:

$$1 = (1 - \cos \theta) \exp(-\Delta T / T1).$$

5. A magnetic resonance diagnosis apparatus according to claim 1, wherein the bandwidth of the inversion pulse is set in a relatively wide band, on the basis of at least one of the timely fluctuations of intensity of the static magnetic field and spatial fluctuations of intensity of the static magnetic field.

6. A magnetic resonance diagnosis apparatus according to claim 5, wherein the bandwidth of the inversion pulse is set in a relatively wide band, including the fluctuation width of the resonance frequency of one of the spins of the nuclide contained in the first molecule and spins of the same nuclide contained in the second molecule, corresponding to the fluctuations of the intensity of static magnetic field of about 5 ppm.

7. A magnetic resonance diagnosis apparatus according to claim 6, wherein the bandwidth of the inversion pulse is set at 300 Hz or more when the intensity of the static magnetic field is 1.5 tesla.

8. A magnetic resonance diagnosis apparatus according to claim 1, further comprising:

means for applying at least one spoiler gradient magnetic field pulse in an interval between the inversion pulse and the excitation pulse.

9. A magnetic resonance diagnosis apparatus according to claim 1, further comprising:

means for applying a chemical shift selective pulse for selectively exciting the other one of the spins of the nuclide contained in the first molecule and the spins of the same nuclide contained in the second molecule; and means for controlling the center frequency of the chemical shift selective pulse on the basis of the resonance frequency data or the data corresponding to resonance frequency.

10. A magnetic resonance diagnosis apparatus according to claim 1, further comprising:

plural shim coils;

means for supplying a current flowing to the plural shim coils; and means for individually controlling the current flowing in the plural shim coils depending on the magnetic field distribution data of the static magnetic field or the data corresponding to this magnetic field distribution.

11. A magnetic resonance diagnosis apparatus comprising:

means for suppressing one of spins of a nuclide contained in a first molecule and spins of the same nuclide contained in a second molecule depending on the difference in the longitudinal relaxation time;

means for collecting MR signals from other one of the spins of the nuclide contained in the first molecule and the spins of the same nuclide contained in the second molecule; and means for determining at least one of the resonance frequency data of the other one of the spins of the nuclide contained in the first molecule and the spins of the same nuclide contained in the second molecule, the data corresponding to this resonance frequency, the magnetic field distribution data of the static magnetic field, and the data corresponding to this magnetic field distribution data, on the basis of the MR signals.

12. A magnetic resonance diagnosis apparatus comprising:

a radio frequency coil for generating a radio frequency magnetic field;

a radio frequency coil driver for supplying a current flowing to the radio frequency coil;

a receiver for receiving an MR signal through the radio frequency coil;

a controller for controlling the radio frequency coil driver for executing a specified pulse sequence, in the pulse sequence, in order to selectively suppress one of spins of a nuclide contained in a first molecule and spins of the same nuclide contained in a second molecule depending on the difference in the longitudinal relaxation time, having an inversion pulse applied to the subject in a static magnetic field, and an excitation pulse applied after a delay time depending on the time constant of longitudinal relaxation of one of the spins of the nuclide contained in the first molecule and the spins of the same nuclide contained in the second molecule from this inversion pulse; and a processor for determining at least one of the resonance frequency data of the other one of the spins of the nuclide contained in the first molecule and the spins of the same nuclide contained in the second molecule, the data corresponding to this resonance frequency, the magnetic field distribution data of the static magnetic field, and the data corresponding to this magnetic field distribution data, on the basis of the MR signals.

13. A magnetic resonance diagnosis apparatus according to claim 12, wherein the delay time is set so that the longitudinal magnetized components of the spins of the nuclide contained in the first molecule and the spins of the same nuclide contained in the second molecule may be substantially zero in the center of the excitation pulse.

14. A magnetic resonance diagnosis apparatus according to claim 12, wherein the bandwidth of the inversion pulse is set in a relatively wide band, including the fluctuation width of the resonance frequency of one of the spins of the nuclide contained in the first molecule and spins of the same nuclide contained in the second molecule, corresponding to the fluctuations of the intensity of static magnetic field of about 5 ppm.

* * * * *